US008007389B2

(12) United States Patent
Yudate et al.

(10) Patent No.: US 8,007,389 B2
(45) Date of Patent: Aug. 30, 2011

(54) HEAVY OBJECT TURNING APPARATUS

(75) Inventors: Toshihiro Yudate, Tsu (JP); Shuji Akiyama, Nirasaki (JP); Hiroshi Yamada, Nirasaki (JP); Nobuhiro Kameda, Nirasaki (JP)

(73) Assignees: Nabtesco Corporation, Tokyo (JP); Tokyo Electron Limited, Tokyo (JP)

( * ) Notice: Subject to any disclaimer, the term of this patent is extended or adjusted under 35 U.S.C. 154(b) by 934 days.

(21) Appl. No.: 11/574,444

(22) PCT Filed: Sep. 2, 2005

(86) PCT No.: PCT/JP2005/016120
§ 371 (c)(1),
(2), (4) Date: Feb. 28, 2007

(87) PCT Pub. No.: WO2006/025529
PCT Pub. Date: Mar. 9, 2006

(65) Prior Publication Data
US 2008/0298948 A1 Dec. 4, 2008

(30) Foreign Application Priority Data

Sep. 2, 2004 (JP) .................................. 2004-255107
Jun. 9, 2005 (JP) .................................. 2005-169492

(51) Int. Cl.
*F16H 48/06* (2006.01)
(52) U.S. Cl. ........................................ 475/149; 475/162
(58) Field of Classification Search .................. 475/149, 475/162
See application file for complete search history.

(56) References Cited

U.S. PATENT DOCUMENTS

| 4,690,010 | A | | 9/1987 | Matsumoto et al. |
| 5,203,748 | A | * | 4/1993 | Sawada et al. ............. 74/490.01 |
| 5,293,107 | A | * | 3/1994 | Akeel ............................. 901/25 |
| 5,934,148 | A | * | 8/1999 | Haniya et al. ............. 74/490.06 |
| 7,534,184 | B2 | * | 5/2009 | Tsurumi ....................... 475/162 |
| 2004/0051517 | A1 | | 3/2004 | Holt et al. |
| 2007/0258799 | A1 | * | 11/2007 | Akiyama et al. ......... 414/331.02 |

FOREIGN PATENT DOCUMENTS

JP 62-004586 A 1/1987

(Continued)

OTHER PUBLICATIONS

Office Action Issued Mar. 31, 2011 in JP Application No. 2005-169492.

*Primary Examiner* — David D Le
*Assistant Examiner* — Derek D Knight
(74) *Attorney, Agent, or Firm* — Panitch Schwarze Belisario & Nadel LLP

(57) ABSTRACT

A technique of a heavy object turning apparatus that is compact, is enabled to reduce the distance between the center of gravity of a heavy object and a pivot positioned on an axis, and is configured so that a turning arm and a drive unit has a length in the direction of an axis passing through the pivot around which the heavy object is turned. A control unit fixes a support base onto a stand. An orthogonal axis reduction gear serves as an anterior reduction gear and has a configuration in which an output shaft is on an axis of a planetary gear type reduction gear serving as the posterior reduction gear. An input shaft is perpendicular to the axis. The orthogonal reduction gear is constituted by a hypoid reduction gear or a worm-geared reduction gear. A motor is disposed on the bottom surface of the orthogonal reduction gear.

5 Claims, 8 Drawing Sheets

FOREIGN PATENT DOCUMENTS

| | | |
|---|---|---|
| JP | 63-224649 A | 9/1988 |
| JP | 9-109082 A | 4/1997 |
| JP | 09298224 A | 11/1997 |
| JP | 2001221828 A | 8/2001 |
| JP | 2003525433 T | 8/2003 |
| WO | 2005093820 A1 | 10/2005 |

* cited by examiner

HEAVY OBJECT TURNING APPARATUS

CROSS-REFERENCE TO RELATED APPLICATIONS

This application is a Section 371 of International Application No. PCT/JP2005/016120, filed Sep. 2, 2005, which was published in the Japanese language on Mar. 9, 2006 under International Publication No. WO/2006/025529, the disclosure of which is incorporated herein by reference.

BACKGROUND OF THE INVENTION

A conventional testing apparatus, for example, a probe apparatus comprises a loader unit, which has a conveyance mechanism adapted to convey semiconductor wafers one by one, and also comprises a prober unit adapted to continuously perform electrical tests on the semiconductor wafers. The prober unit has a mount table configured so that semiconductor wafers are transferred one by one between the mount table and the conveyance mechanism, a probe card disposed above the mount table, and a test head adapted to electrically interrupt between the probe card and a tester. The test head is fixed to a rotating shaft through a test head frame and hinges. The test head can turn around the rotating shaft, for example, 180° between a probe apparatus main body and a maintenance area. Recently, the test head has grown in size, so that the weight thereof has reached to 600 kg to 800 kg. To turn such a test head, which is a heavy object, a motor is frequently used. Additionally, the following Patent Document 1 discloses a technique that is substantially the same as the above-described conventional technique.

Patent Document 1: JP-A-9-298224.

BRIEF SUMMARY OF THE INVENTION

The present invention relates to a heavy object turning apparatus, which is applied to a probe apparatus or the like for measuring electric characteristics of a test target such as a semiconductor device, and which is configured to turn a heavy object, such as a test head.

Problems that the Invention is to Solve

However, a structure of the conventional testing apparatus, such as the probe apparatus, in which the weight of a test head is supported by a motor and gears, have the following problems. That is, the gear for transmitting a driving force of the motor is enlarged. Also, the gears are arranged in a multistage configuration. Consequently, the configuration of the apparatus is complex. The cost of the apparatus is increased. Also, because the test head is turned around the enlarged gear, a turning radius cannot be reduced. The installation space for the probe apparatus is increased.

Means for Solving the Problems

The invention is accomplished to solve the above problems, and aims at providing a heavy object turning apparatus which is enabled to reduce the length in the direction of the axis of a rotation shaft of a drive unit without using an enlarged gear, and which has a small number of components.

The invention can be implemented by the following configuration or means.

(1) A heavy object turning apparatus having a turning arm which is connected to a heavy object and is turned around a pivot, and a drive unit adapted to drive the turning arm to turn, characterized by comprising a planetary gear type reduction gear which has a stationary portion, a rotation input portion, a rotation output portion having an orthogonal flat surface perpendicular to the axis passing through the pivot, and a pair of roller bearings disposed between the stationary portion and the rotation output portion, an orthogonal axis reduction gear configured so that an output axis is on the axis of the planetary gear type reduction gear and that an input shaft is perpendicular to the axis, and a motor configured so that a motor shaft is disposed in parallel to the orthogonal flat surface, and characterized in that the turning arm has a first flat surface connected to the orthogonal flat surface of the rotation output portion and also has a second flat surface which is connected to the heavy object and is placed to a heavy object side than the axis passing through the pivot and which has a second flat surface perpendicular to the first flat surface, and that the turning arm and the drive unit are disposed in a width in a direction of the axis passing through the pivot around which the heavy object is turned.

(2) Preferably, the heavy object turning apparatus according to the invention further comprises a support base, to which the drive unit is fixed, and a stand on which the support base is placed, and characterized in that a concave portion is formed in the stand, and that the motor is accommodated in the concave portion.

(3) A heavy object turning apparatus having a turning arm which is connected to a heavy object and is turned around a pivot, and a drive unit adapted to drive the turning arm to turn. Preferably, the heavy object turning apparatus comprises a planetary gear type reduction gear which has a stationary portion, a rotation input portion, a rotation output portion having an orthogonal flat surface perpendicular to the axis passing through the pivot, and a pair of roller bearings disposed between the stationary portion and the rotation output portion, an orthogonal axis reduction gear configured so that an output axis is on the axis of the planetary gear type reduction gear and that an input shaft is perpendicular to the axis, and a motor configured so that a motor shaft is disposed in parallel to the orthogonal flat surface. Also, preferably, the turning arm has a first flat surface connected to the orthogonal flat surface of the rotation output portion and also has a second flat surface perpendicular to the first flat surface. Additionally, the turning arm and the drive unit are disposed in a width in a direction of the axis passing through the pivot around which the heavy object is turned.

Advantages of the Invention

The heavy object turning apparatus according to the invention has the above configuration. Thus, the invention has the following advantages. That is, according to the invention, there is provided a heavy object turning apparatus having a turning arm which is connected to a heavy object and is turned around a pivot, and a drive unit adapted to drive the turning arm to turn. The heavy object turning apparatus features that the drive unit has a stationary portion, a rotation input portion, a rotation output portion having an orthogonal flat surface perpendicular to the axis passing through the pivot, and a planetary gear type reduction gear a having a pair of roller bearings disposed between the stationary portion and the rotation output portion, an orthogonal axis reduction gear configured so that an output axis is on the axis of the planetary gear type reduction gear and that an input shaft is perpendicular to the axis, and a motor configured so that a motor shaft is disposed in parallel to the orthogonal flat surface. Also, the heavy object turning apparatus features that the turning arm has a first flat surface connected to the orthogonal flat surface of the rotation output portion and also has a second flat surface perpendicular to the first flat surface which is connected to the heavy object and is placed to a heavy object side than the axis passing through the pivot, and the turning arm and the drive unit are disposed in the width of the heavy object in a direction of the axis passing through the pivot around which the heavy object is turned.

With such a configuration, the heavy object turning apparatus can be configured so that the heavy object turning apparatus can be compact, that the length in the direction of the axis of the rotation shaft of the drive unit can be reduced, that a space portion can be assured in the direction of the axis of the drive unit, and that the turning arm and the drive unit are placed within a width in the direction of the axis passing through the pivot around which the heavy object is turned.

According to the invention, there is provided the heavy object turning apparatus that the heavy object turning apparatus further comprises a support base, to which the drive unit is fixed, and a stand on which the support base is placed. Also, the heavy object turning apparatus features that a concave portion is formed in the stand, and that the motor is accommodated in the concave portion.

With such a configuration, the invention has an advantage in that the heavy object turning apparatus can be compacted, in addition to the advantages of the invention described in claim 1.

According to the invention, there is provided a heavy object turning apparatus having a turning arm which is connected to a heavy object and is turned around a pivot, and a drive unit adapted to drive the turning arm to turn. The heavy object turning apparatus features that the drive unit has a stationary portion, a rotation input portion, a rotation output portion having an orthogonal flat surface perpendicular to the axis passing through the pivot, and a planetary gear type reduction gear having a pair of roller bearings disposed between the stationary portion and the rotation output portion, an orthogonal axis reduction gear configured so that an output axis is on the axis of the planetary gear type reduction gear and that an input shaft is perpendicular to the axis, and a motor configured so that a motor shaft is disposed in parallel to the orthogonal flat surface. The heavy object turning apparatus features that the turning arm has a first flat surface connected to the orthogonal flat surface of the rotation output portion and also has a second flat surface perpendicular to the first flat surface, and that the turning arm and the drive unit are disposed in the width of the heavy object in a direction of the axis passing through the pivot around which the heavy object is turned.

With such a configuration, the heavy object turning apparatus can be configured so that the heavy object turning apparatus can be compact, that the length in the direction of the axis of the rotation shaft of the drive unit can be reduced, that a space portion can be assured in the direction of the axis of the drive unit, and that the turning arm and the drive unit are placed within a width in the direction of the axis passing through the pivot around which the heavy object is turned.

DETAILED DESCRIPTION OF THE INVENTION

Hereinafter, embodiments of a heavy object turning apparatus according to the invention are described below in detail with reference to the accompanying drawings.

Figure 1:
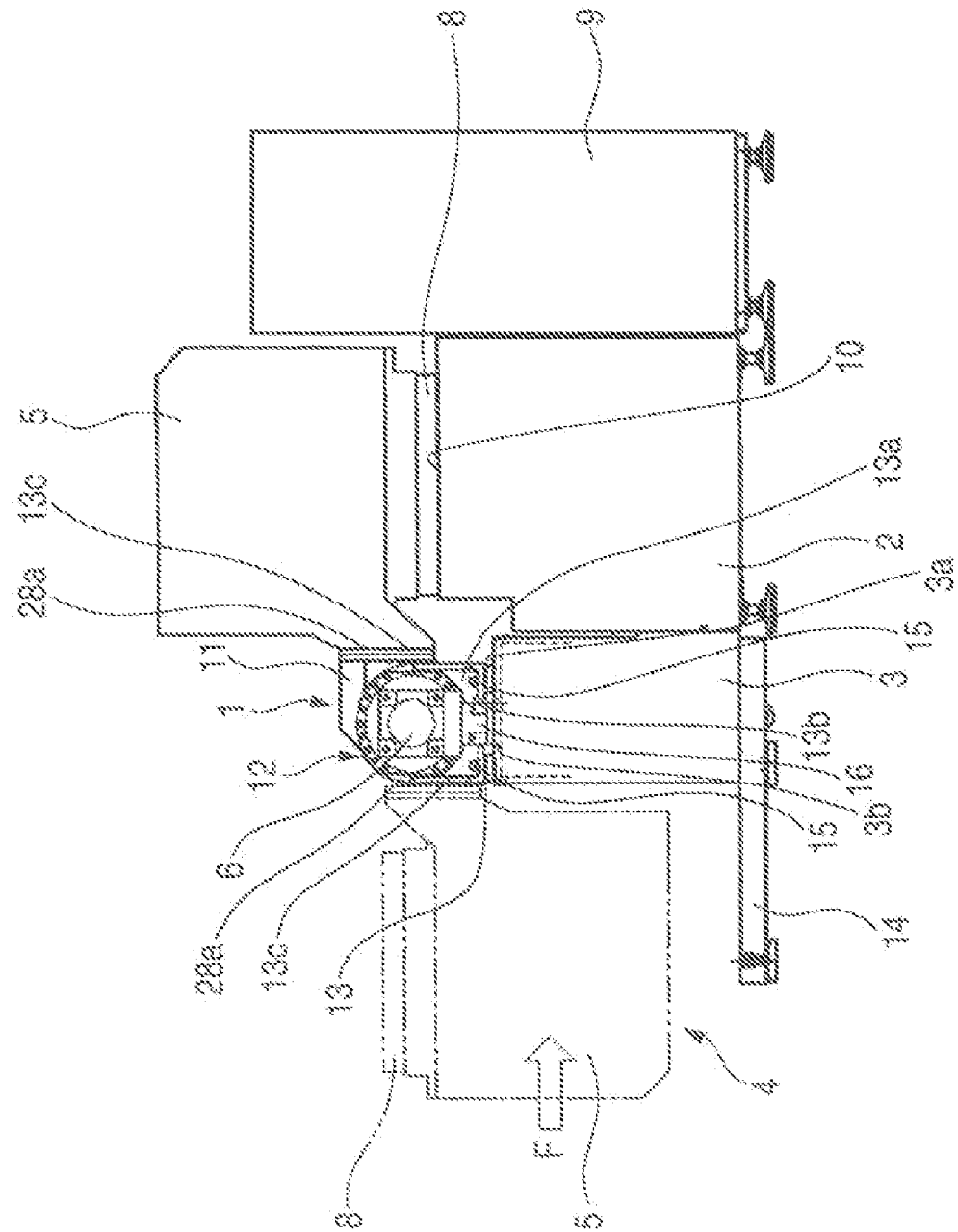
FIG. 1 is a front view illustrating a preferred example of a mode for implementing a heavy object turning apparatus according to the invention.

As shown in, for example, FIG. 1, a probe apparatus 1 includes a probe apparatus body (hereunder referred to simply as an "apparatus body") 2 constituting a prober unit adapted to perform an electrical test on a test target, for example, a semiconductor wafer, a stand 3 disposed adjoining the left side of the apparatus body 2, a test head 5 serving as a heavy object adapted to be turned between the apparatus body 2 and a maintenance area 4 by the stand 3 nearly 180°, and a connecting ring 8. A semiconductor wafer conveyance apparatus 9 adapted to accommodate semiconductor wafers in units of cassettes and to load the semiconductor wafers from the cassette one by one and to unload the semiconductor wafers from the prober unit one by one is disposed at the right side of the apparatus body 2.

Also, a probe card (not shown) is provided in a central hole (not shown) of a head plate 10 constituting the ceiling of the apparatus body 2. When the test head 5 turns and is positioned above the apparatus body 2, the test head 5 is electrically connected to a connection terminal provided on the top surface of the probe card through a connection ring 8. Thus, the probe apparatus 1 is configured so that for example, a test signal from the tester is received at an electrode of a semiconductor wafer placed on a table through the test head 5 and the probe card, and a probe needle, and that then, an electrical test is performed on each IC chip provided on the semiconductor wafer.

Figure 2:
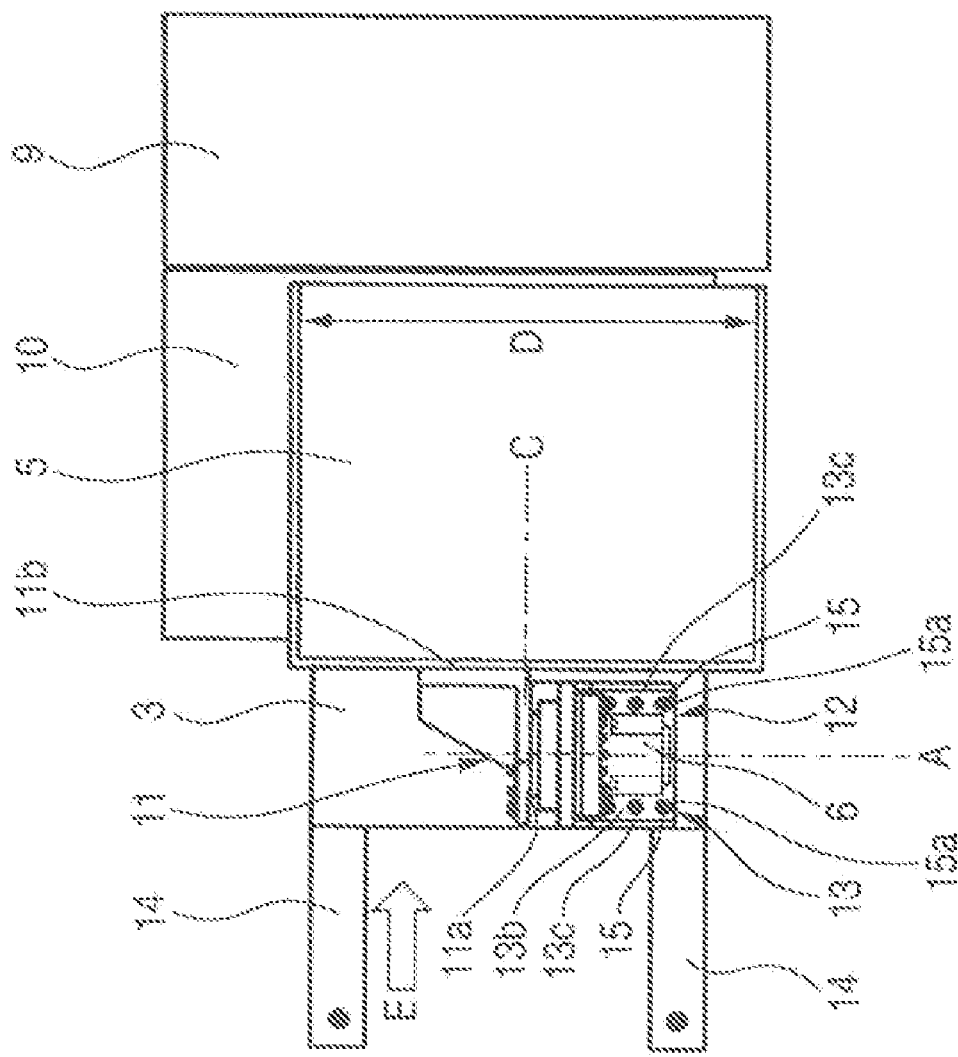
FIG. 2 is a front view illustrating the preferred example of the mode for implementing the heavy object turning apparatus shown in FIG. 1 according to the invention.

As shown in FIG. 2, the test head 5 is fixed to a rotating shaft of a drive unit 12 through a turning arm 11 having a first flat surface 11a and a second flat surface 11b formed perpendicular to the first flat surface 11a. Thus, the test head 5 can turn through the rotating shaft. The turning arm 11 turns around a pivot set on an axis A of the rotating shaft of the drive unit 12. The drive unit 12 turn-drives the turning arm 11 and is provided on the top surface of the stand 3 through a support base 13. The support base 13 has a first attaching surface 13a attached to the drive unit 12 or to an attaching flat surface of a stationary portion of a planetary gear type reduction gear accommodated in the drive unit 12, that is, a stationary case 28 (see FIG. 4). The support base 13 also has a second attaching surface 13b perpendicular to the first attaching surface 13a, and a pair of rib portions 13c, 13c that connect both outer end portions of the first attaching surface 13 to both outer end portions of the second attaching surface 13b.

In FIG. 1, reference numeral 14 designates an installation base on which the stand 3 accommodating a control unit is installed. Reference numerals 15, 15 designate bolts. The bolts 15, 15 are inserted into unloaded holes 15a, 15a shown in FIGS. 2 and 3, which are formed in the second attaching surface 13b and are somewhat elongated. Then, the second attaching surface 13b is laterally positioned. Thus, the support base 13 is non-rotatably fixed on the stand 3. An orthogonal axis reduction gear 6 serving as the anterior reduction gear is disposed in front of the posterior reduction gear 26. The orthogonal axis reduction gear 6 has a configuration in which an output shaft of the orthogonal axis reduction gear 6 is on the axis A of the planetary gear type reduction gear, and in which an input shaft of the orthogonal axis reduction gear 6 is perpendicular to the axis A of the planetary gear type reduction gear. The orthogonal axis reduction gear 6 is constituted by a hypoid reduction gear or a worm-geared reduction gear. Reference numeral 16 denotes a motor configured to be placed on the bottom surface of the orthogonal axis reduction gear 6. The bottom portion of the motor 16 is interposed between the gear 6 and the stand 3. The motor shaft of the motor 16 is connected to a gear portion including the hypoid gear or a worm wheel of the orthogonal axis reduction gear 6. A concave portion 3b including a hole is formed in the top surface 3a of the stand 3. A part of the drive unit 12, that is, the motor 16 is accommodated in the concave portion 3b.

In FIG. 1, reference numeral 14 designates an installation base on which the stand 3 accommodating a control unit is installed. Reference numerals 15, 15 designate bolts. The bolts 15, 15 are inserted into unloaded holes 15a, 15a shown in FIGS. 2 and 3, which are formed in the second attaching surface 13b and are somewhat elongated. Then, the second attaching surface 13b is laterally positioned. Thus, the support base 13 is fixed on the stand 3. An orthogonal axis reduction gear 6 serving as the anterior reduction gear is disposed in front of the posterior reduction gear 26. The orthogonal axis reduction gear 6 has a configuration in which an output shaft of the orthogonal axis reduction gear 6 is on the axis A of the planetary gear type reduction gear, and in which an input shaft of the orthogonal axis reduction gear 6 is perpendicular to the axis A of the planetary gear type reduction gear. The orthogonal axis reduction gear 6 is constituted by a hypoid reduction gear or a worm-geared reduction gear. Reference numeral 16 denotes a motor configured to be placed on the bottom surface of the orthogonal axis reduction gear 6. The bottom portion of the motor 16 is interposed between the gear 6 and the stand 3. The motor shaft of the motor 16 is connected to a gear portion including the hypoid gear or a worm wheel of the orthogonal axis reduction gear 6. A concave portion 3b including a hole is formed in the top surface 3a of the stand 3. A part of the drive unit 12, that is, the motor 16 is accommodated in the concave portion 3b.

Figure 3:
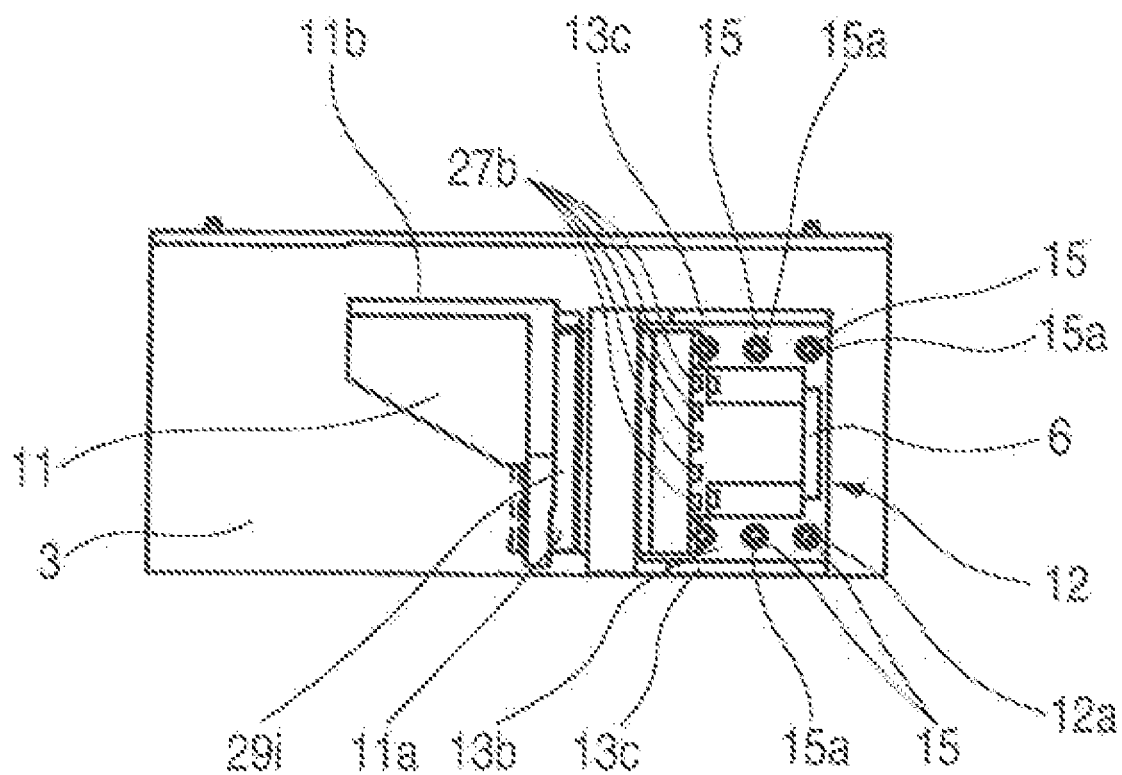
FIG. 3 is a side view, taken in the direction of an arrow E shown in FIG. 2, illustrating a stand and a drive unit in the preferred embodiment of the heavy object turning apparatus according to the invention.
Figure 5:
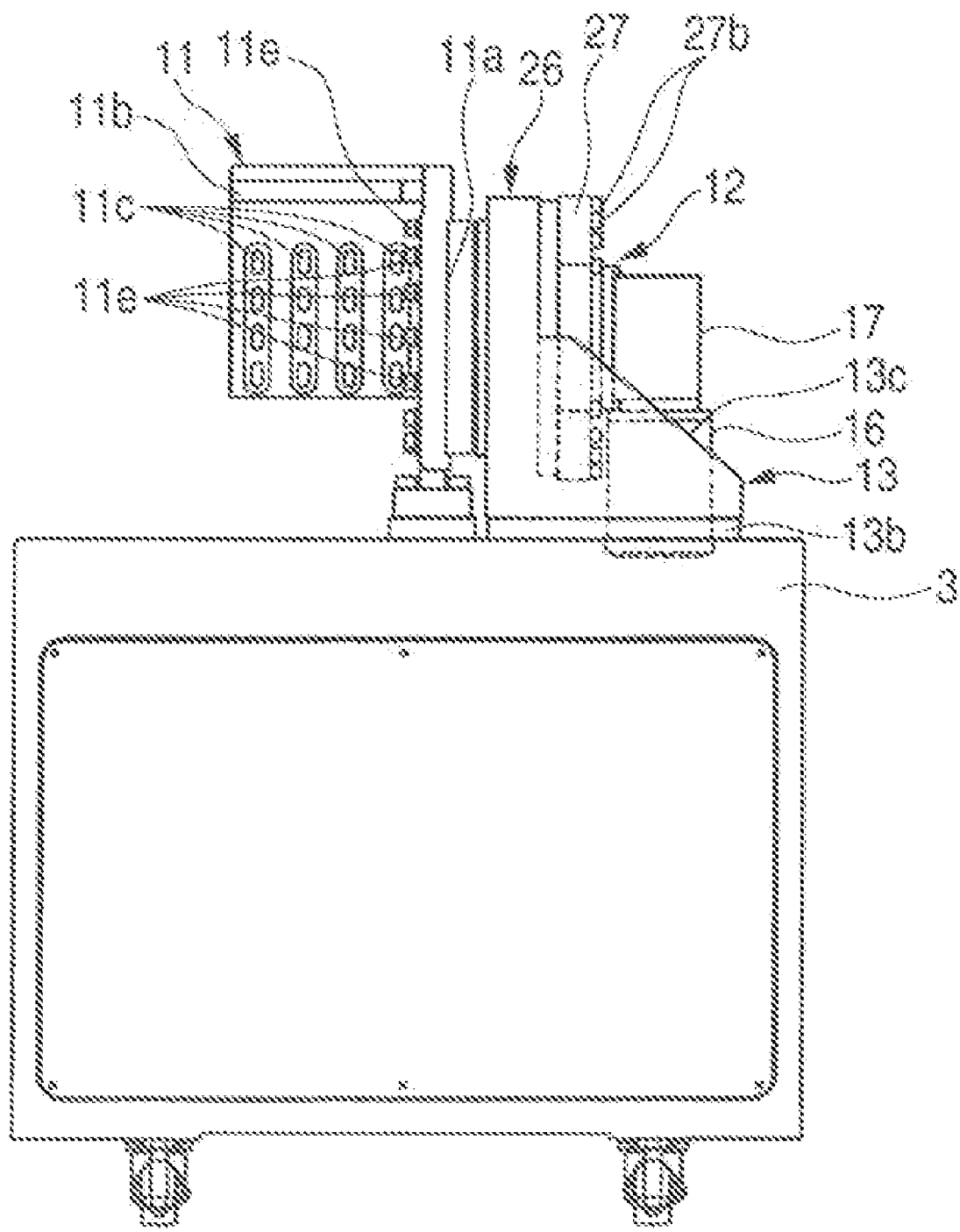
FIG. 5 is a side view, taken in the direction of an arrow F shown in FIG. 1, illustrating the first embodiment of the heavy object turning apparatus according to the invention.
Figure 8:
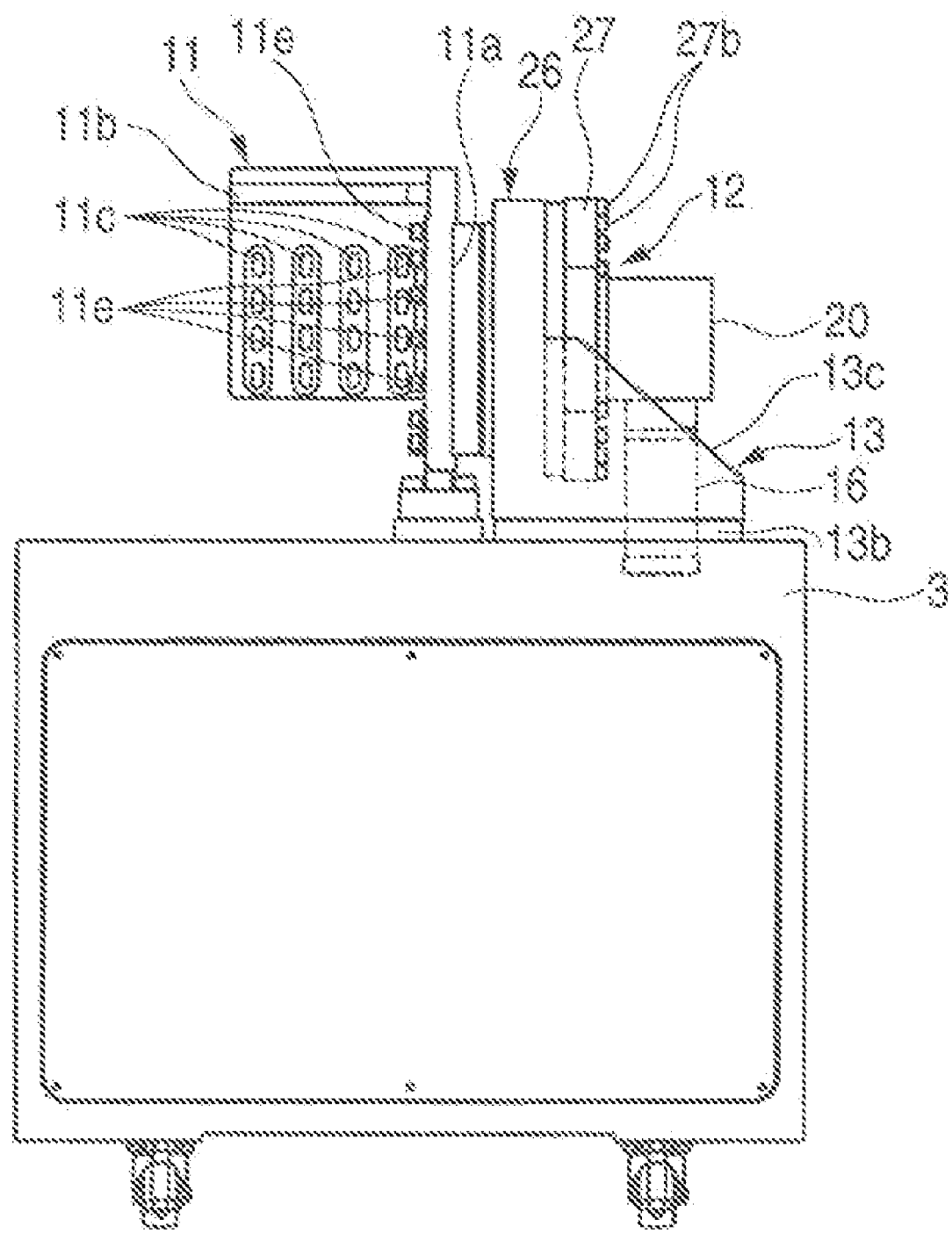
FIG. 8 is a side view, taken in the direction of the arrow F shown in FIG. 1, illustrating the second embodiment of the heavy object turning apparatus according to the invention.

As shown in FIGS. 2 and 3, the first flat surface 11a of the turning arm 11 is attached to a rotation output portion of the drive unit 12. As shown in FIGS. 5 and 8, for example, four rows of elongated holes 11c, 11c, . . . are bored in a part of the turning arm 11, which is at the side of the second flat surface 11b. Then, bolts (not shown) are screwed into the elongated holes 11c, 11c, . . . . The turning arm 11 is fixed to the test head 5 by adjusting the position in the up-down direction of the turning arm to that of the test head 5.

First Embodiment

Next, a first embodiment of the heavy object turning apparatus according to the invention is described below in detail with reference to FIGS. 4 and 5.

The drive unit 12 roughly includes the motor 16, the anterior reduction mechanism driven by the motor 16 to perform deceleration rotation, and the posterior reduction gear 26 serving as the posterior reduction mechanism connected to the anterior reduction mechanism. Although the posterior reduction mechanism may be constituted by a single reduction mechanism, the drive unit 12 includes the anterior reduction mechanism which performs a first reduction of a rotation shaft speed of the motor 16, and also includes the posterior reduction mechanism that performed a second reduction of the rotation shaft speed reduced by the anterior reduction mechanism.

The drive unit 12 according to the first embodiment shown in the drawings is an example in which the reduction mechanism accommodated therein includes a planetary gear type reduction gear serving as the posterior reduction gear 26, and also includes a hypoid reduction gear 17 serving as the anterior reduction mechanism.

Reference numeral 16 designates a motor which has a motor case 16a serving as a cylindrical stator, a motor shaft 16b that is rotatably supported and serves as an input shaft of the anterior reduction mechanism, and a hypoid pinion 16c formed at an end portion of the motor shaft 16b. The hypoid pinion 16c is plunged into a through hole 17c of a lower portion 17b of a hypoid reduction gear 17 (to be described later). The through hole 17c has a bearing 25 for the hypoid pinion 25 so as to allow the hypoid pinion 16c to be rotatable. Reference numeral 17 denotes a hypoid reduction gear serving as the anterior reduction mechanism which has a substantially rectangular box-like gear case 17a. A rear surface 17e of the gear case 17a is fixed to a front wall 27a of a connecting member 27 of the posterior reduction gear 26 with an engaging means 27c including a bolt and a hole. The lower portion 17b of the gear case 17a fixes the motor case 16a with bolts 18, 18.

The hypoid reduction gear 17 has hypoid gears 19 that mesh with the hypoid pinion 16c. One of the hypoid gears 19 is connected to a rotor shaft 26a of the posterior reduction gear 26. The other hypoid gear 19 is connected to a pinion shaft 19a. The front end of the pinion shaft 19a is rotatably supported by the bearing 17d disposed on the front surface 17f of the gear case 17a serving as a bracket by means of the shaft. Thus, the hypoid gear 19 is made to be rotatable.

Next, the posterior reduction gear 26 is described below.

The posterior reduction gear 26 has an cylindrical internally-toothed gear element 28 serving as a stationary case having a plurality of internally toothed pins 30c2 as internally toothed gears provided mainly in an inner circumferential portion. The posterior reduction gear 26 also has a pair of externally toothed gears 30c that are externally toothed gears having peritrochoidal forms, which mesh with the internally toothed pins 30c2 of the internally-toothed gear element 28, and that are adapted to eccentrically swing. The posterior reduction gear 26 also has a pinion gear 26b formed on the rotor shaft 26a serving as an rotation input portion, a shaft 29 serving as a rotation output portion, and a planetary gear type reduction gear 31 having main bearings 30b, 30b that serve as a pair of anterior and posterior roller bearings interposed between the internally-toothed gear element 28 and the shaft 29. The rotor shaft 26a is connected to one of the hypoid gears 19. The shaft 29 has a first end plate 29a, whose outer circumferential surface engages with an anterior main bearing 30a, and a second end plate 29c that has a pillar portion 29b loosely fit in the internally-toothed gear element 28 and that the outer circumferential surface of the second end plate 29c engages with a posterior main bearing 30b. A step-like cylindrical connecting member 27 is adjacently connected to the front surface of the internally-toothed gear element 28 with a bolt 27b.

Then, the first end plate 29a and the second end plate 29c having the pillar portion 29b are adjacently connected to each other with a tapered pin (not shown), which is engaged in a shaft hole 29d formed in the first end plate 29a and the second end plate 29c, and a bolt 32. The anterior pinion gear 26b meshes with a spur gear 29g provided on a crankshaft 29f. The crankshaft 29f is rotatably supported by the first end plate 29a and the second end plate 29c and engages with the externally toothed gear 30c through a needle bearing 30c1. The rotation of the rotor shaft 26a is decelerated between the pinion gear 26b and the spur gear 29g and is transmitted to the crankshaft 29f. The rotation of the crankshaft 29f causes the externally toothed gear 30c to eccentrically swing, and also causes the shaft 29 to perform a decelerated output rotation. The reduction ratio of the posterior reduction gear 26 is set to be, for example, about 1/100.

Incidentally, in the drawings, reference numeral 24 designates a bearing of the rotor shaft provided in the shaft center of the connecting member 27. The rotor shaft 26a is rotatably configured.

Thus, the turning arm 11 is connected with a bolt (not shown) to the orthogonal flat surface 29i of the second end plate 29c, which is perpendicular to the axis A passing through the pivot of the turning arm 11. Also, the turning arm 11 has a first flat surface 11a which is connected to the shaft 29 serving as the rotation output portion, i.e., to a flat surface of the second end plate 29c, and also has a second flat surface 11b that is connected to a heavy object such as the test head 5, and is perpendicular to the first flat surface 11a located at a place to a heavy object side than the axis A passing through the pivot. As shown in FIG. 2, the turning arm 11 and the drive unit 12 are disposed within a width D of the test head 5 serving as the heavy object placed in the direction of the axis A passing through the pivot of the turning arm 11.

Incidentally, a dot-dash-line C indicates the central position in the direction of the axis A of the heavy object, that is, the test head 5. Thus, a heavy object turning apparatus can be configured so that the heavy object turning apparatus is compact, that the distance between the center of gravity of the heavy object such as the test head 5 and the pivot positioned on the axis A is decreased, and that the turning arm 11 and the drive unit 12 are positioned within a width D in the direction of the axis A passing through the heavy object. The central position C in the direction of the axis A passing through the pivot of the heavy object such as the test head 5 is set within a distance L from a point of intersection P at which a line B inclined to one of the pair of the main bearings 30b, which is placed at the perpendicular flat surface side of the rotation output portion, at a contact angle α (°) intersects with the axis A passing through the pivot. It was found that preferably, the contact angle α (°) is set to be 35° to 45°.

With this configuration, the heavy object such as the test head 5 could be supported in a cantilevered manner. Also, the heavy object could stably be turned.

Figure 4:
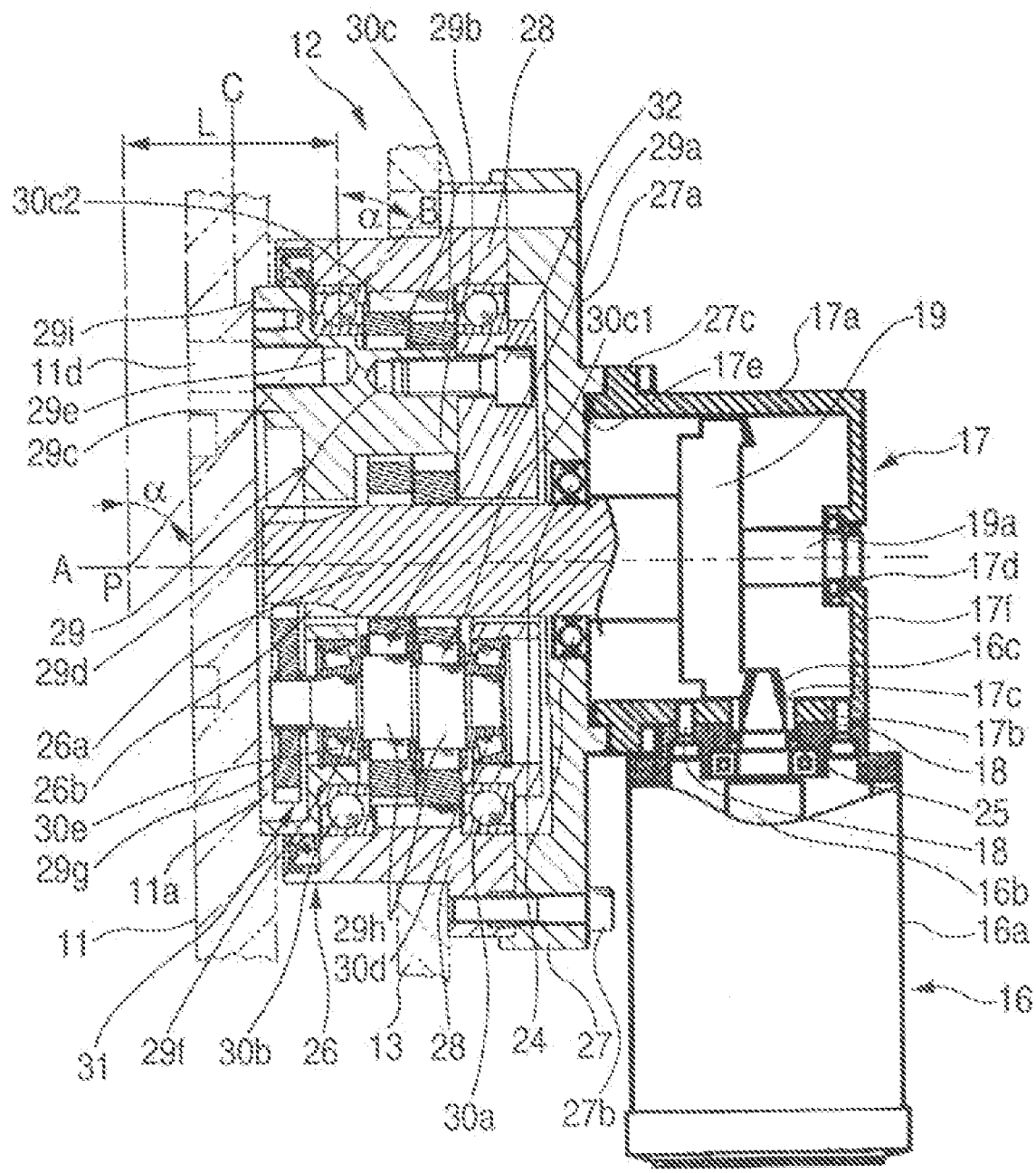
FIG. 4 is a vertically cross-sectional view illustrating a first embodiment of the heavy object turning apparatus according to the invention.

As shown in FIG. 4, somewhat elongated bolt insertion holes 11d, 11d, . . . are provided around the periphery of the turning arm 11 in a part at the side of the first flat surface 11a thereof at desired intervals. Then, bolts 11e, 11e, . . . shown in FIG. 5 are engaged and screwed in a shaft hole 29e. The heavy object is fixed to the turning arm 11 by positioning the heavy object in the direction of the drive unit 12 and adjusting the movement thereof in the up-down direction or the lateral direction. Although described in "Best Mode for Carrying Out the Invention", similarly, a concave portion 3b is formed in a top surface 3a of the stand 3 in the first embodiment of the heavy object turning apparatus. A part of the drive unit 12, that is, the motor 16 is accommodated in the concave portion 3n or the hole.

Next, an operation of the first embodiment of the heavy object turning apparatus according to the invention is described below.

The motor 16 rotates at high speed to turn-drive the heavy object such as the test head 5 between a position indicated by a solid line and a position indicated by an imaginary line. Thus, the motor shaft 16b rotates at high speed inside the motor case 16a. The hypoid pinion 16c formed at an end portion of the motor shaft 16b engages with the hypoid gear 19 of the hypoid reduction gear 17 serving as the reduction mechanism. The torque of the motor is transmitted to the hypoid gear 19. A rotation operation of the hypoid gear 19 causes the rotor shaft 26a serving as a rotation output portion to perform a decelerated rotation. Then, the rotation speed of the motor 16 is decreased by the hypoid reduction gear 17 to, for example, about (1/60) the original speed thereof.

Subsequently, the torque of the hypoid gear 19, whose rotation speed has been reduced to a first level as above described, is transmitted to the rotor shaft 26a serving as the rotation input portion. The rotor shaft 26a rotates at a speed reduced by the hypoid reduction gear 17 serving as the anterior reduction mechanism. Then, the torque is transmitted to the spur gear 29g which meshes and engages with the pinion gear 26b formed at the rear end of the rotor shaft 26a. The rotation of the spur gear 29g causes the crankshaft 29f having a crank portion provided at the substantially center thereof to rotate while supported by the roller bearings 30e and 30d disposed adjacently on the front surface of the spur gear 29g. The torque of the crankshaft 29f is transmitted to the two rows of the adjacent externally-toothed gears 30c, 30c. The rotation operation of each of the externally-toothed gears 30c, 30c causes each of the first end plate 29a and the second end plate 29c having the pillar portion 29b of the shaft 29 serving as the rotation output portion to perform decelerated rotation. Additionally, the second end plate 29c is adjacently connected to the first flat surface 11a of the turning arm 11 with bolts 11e, 11e, . . . , and drives the turning arm 11 to decelerate.

Thus, the heavy object such as the test head is driven to turn about 180° from the position indicated by the imaginary line to the position indicated by the solid line shown in FIG. 1. Then, the test head 5 is electrically connected to the contact provided on the top surface of the probe card through the connecting ring 8. The probe apparatus 1 receives a test signal from the tester at the electrode of the semiconductor wafer set on the mount table through the test head 5 and the probe needle of the probe card. Then, an electrical test is performed on each IC chip of the semiconductor wafer.

Thus, the posterior reduction gear 26 reduces the rotation speed of the hypoid reduction gear 17 serving as the anterior reduction gear to, for example, about (1/100) the original rotation speed thereof. Also, the posterior reduction gear 26 reduces the rotation speed of the motor 16 to, for example, about (1/6000) the original rotation speed thereof. Additionally, a high reduction ratio is obtained by a double reduction mechanism. Thus, the outside diameter of each of the anterior reduction gear 17, the posterior reduction gear 26 and the motor 16 can be reduced. Accordingly, the turning radius of the heavy object such as the test head 5 can be reduced still more. The value of the reduction ratio can be selected by appropriately setting the design dimensions or the shapes of the internal components or the members of the planetary gear type reduction gear 31. Also, the length in the direction of the axis A of the drive unit can be set to be short. Additionally, the drive unit 12 can be compacted.

According to the invention, the heavy object turning apparatus can be constructed using only the anterior reduction gear, that is, only a single reduction gear by fixing the rotor shaft 26a to the turning arm 11.

Second Embodiment

Next, a second embodiment of the heavy object turning apparatus according to the invention is described below in detail with reference to FIGS. 6 through 8.

The drive unit 12 shown in these figures according to the second embodiment shown in the drawings is an example in which the reduction mechanism accommodated therein includes a planetary gear type reduction gear serving as the posterior reduction gear 26, and also includes a worm-geared reduction gear 20 serving as the anterior reduction mechanism. The worm-geared reduction gear 20 is a kind of the orthogonal axis reduction gear.

Reference numeral 16 designates a motor which has a motor case 16a serving as a cylindrical stator, a motor shaft 16b that is rotatably supported and serves as an input shaft of the anterior reduction mechanism, and a worm pinion shaft 22 formed at an end portion of the motor shaft 16b. The worm pinion shaft 22 is inserted into a shaft hole 20c of a lower portion 20b of the worm-geared reduction gear 20 (to be described later). Reference numeral 20 designates the worm-geared reduction gear which has a substantially rectangular box-like gear case 20a. A rear surface 20e of the gear case 20a is fixed to a front wall 27a of a connecting member 27 of the posterior reduction gear 26 with an engaging means 27c or by the engagement of both members. The lower portion 20b of the gear case 20a fixes the motor case 16a.

The worm-geared reduction gear 20 has a worm wheel 21 that meshes with the worm pinion 23. One side of the worm wheel 21 is connected to a rotor shaft 26a of the posterior reduction gear 26. The other side of the worm wheel 21 is connected to a worm wheel shaft 21a. The front end of the worm wheel 21a is rotatably supported by the bearing 20d disposed on the front surface 20f of the gear case 20a serving as a bracket by means of the shaft. Thus, the worm wheel 21 is made to be rotatable.

Incidentally, the worm pinion shaft 22 is rotatably supported by disposing bearings 20h and 20i at an upper portion 20g and a lower portion 20b of the gear case 20a, respectively. Incidentally, the apparatus has what is called a self-lock function of surely transmitting the torque of the motor shaft 16b serving as the input shaft to the posterior reduction gear 26 and of preventing the torque of the posterior reduction gear 26 to the motor shaft 16b. Thus, stability in a maintenance work can be enhanced.

Next, the posterior reduction gear 26 is described below.

The posterior reduction gear 26 has an cylindrical internally-toothed gear element 28 serving as a stationary case having a plurality of internally toothed pins 30c2 as internally toothed gears provided mainly in an inner circumferential portion. The posterior reduction gear 26 also has a pair of externally toothed gears 30c that are externally toothed gears having peritrochoidal forms, which mesh with the internally toothed pins 30c2 of the internally-toothed gear element 28, and that are adapted to eccentrically swing. The posterior reduction gear 26 also has a pinion gear 26b formed on the rotor shaft 26a serving as an rotation input portion, a shaft 29 serving as a rotation output portion, and a planetary gear type reduction gear 31 having main bearings 30b, 30b that serve as a pair of anterior and posterior roller bearings interposed between the internally-toothed gear element 28 and the shaft 29. The rotor shaft 26a is connected to one of the hypoid gears 19. The shaft 29 has a first end plate 29a, whose outer circumferential surface engages with an anterior main bearing 30a, and a second end plate 29c that has a pillar portion 29b loosely fit in the internally-toothed gear element 28 and that the outer circumferential surface of the second end plate 29c engages with a posterior main bearing 30b. A step-like cylindrical connecting member 27 is adjacently connected to the front surface of the internally-toothed gear element 28 with a bolt 27b.

Then, the first end plate 29a and the second end plate 29c having the pillar portion 29b are adjacently connected to each other with a tapered pin (not shown), which is engaged in a shaft hole 29d formed in the first end plate 29a and the second end plate 29c, and a bolt 32. The anterior pinion gear 26b meshes with a spur gear 29g provided on a crankshaft 29f. The crankshaft 29f is rotatably supported by the first end plate 29a and the second end plate 29c and engages with the externally toothed gear 30c through a needle bearing 30c1. The rotation of the rotor shaft 26a is decelerated between the pinion gear 26b and the spur gear 29g and is transmitted to the crankshaft 29f. The rotation of the crankshaft 29f causes the externally toothed gear 30c to eccentrically swing, and also causes the shaft 29 to perform a decelerated output rotation. The reduction ratio of the posterior reduction gear 26 is set to be, for example, about 1/100.

Thus, the turning arm 11 is connected with a bolt (not shown) to the orthogonal flat surface 29i of the second end plate 29c, which is perpendicular to the axis A passing through the pivot of the turning arm 11. Also, the turning arm 11 has a first flat surface 11a which is connected to the shaft 29 serving as the rotation output portion, i.e., to a flat surface of the second end plate 29c, and also has a second flat surface 11b that is connected to a heavy object such as the test head 5, and is perpendicular to the first flat surface 11a located at a place to a heavy object side than the axis A passing through the pivot. As shown in FIG. 2, the turning arm 11 and the drive unit 12 are disposed within a width D of the test head 5 serving as the heavy object placed in the direction of the axis A passing through the pivot of the turning arm 11.

Incidentally, a dot-dash-line C indicates the central position in the direction of the axis A of the heavy object, that is, the test head 5. Thus, a heavy object turning apparatus can be configured so that the heavy object turning apparatus is compact, that the distance between the center of gravity of the heavy object such as the test head 5 and the pivot positioned on the axis A is decreased, and that the turning arm 11 and the drive unit 12 are positioned within a width D in the direction of the axis A passing through the heavy object.

Incidentally, the central position C in the direction of the axis A passing through the pivot of the heavy object such as the test head 5 is set within a distance L from a point of intersection P at which a line B inclined to one of the pair of the main bearings 30b, which is placed at the perpendicular flat surface side of the rotation output portion, at a contact angle α (°) intersects with the axis A passing through the pivot. It was found that preferably, the contact angle α (°) is set to be 35° to 45°.

With this configuration, the heavy object such as the test head 5 could be supported in a cantilevered manner. Also, the heavy object could stably be turned.

Figure 6:
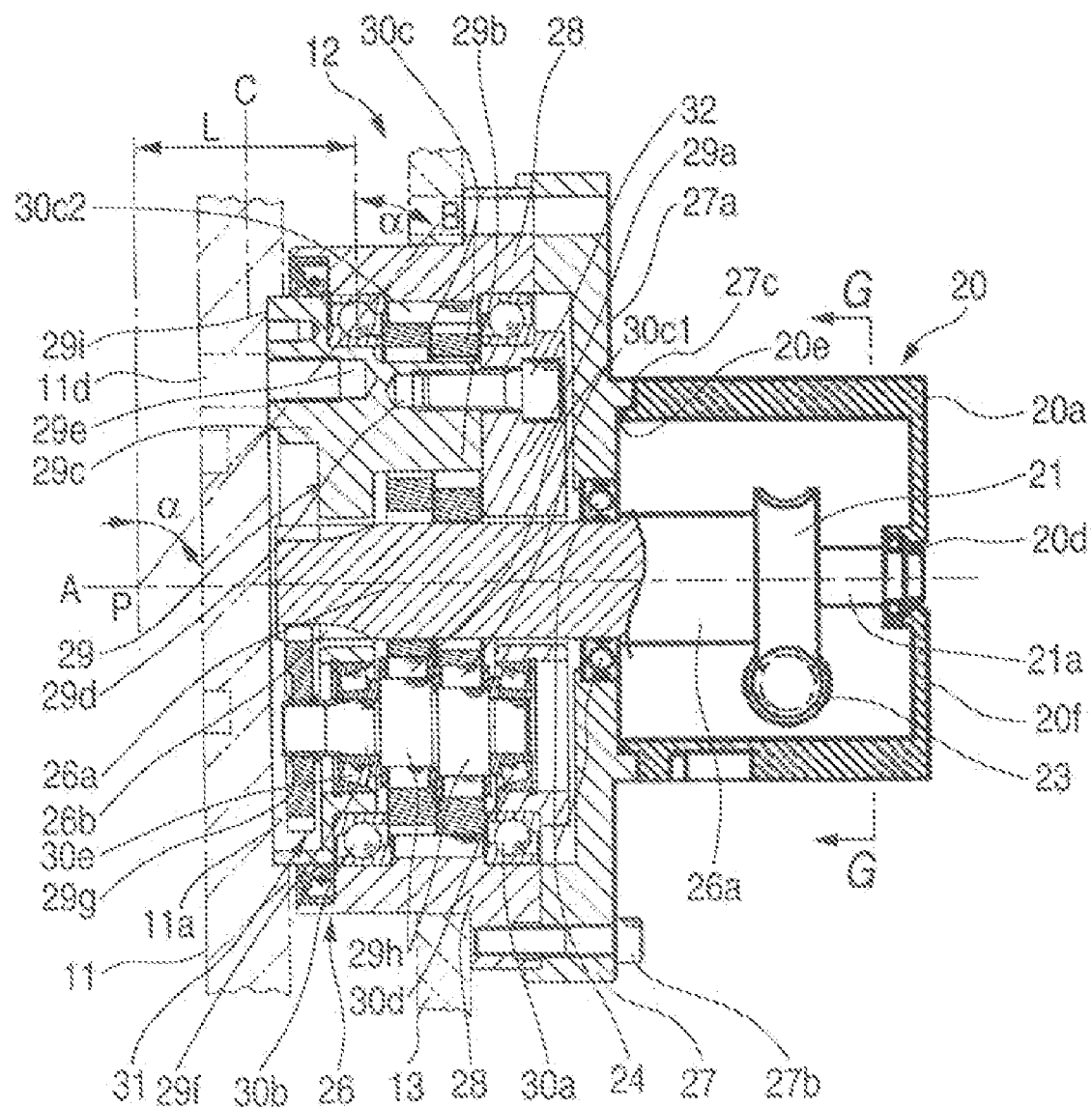
FIG. 6 is a vertically cross-sectional view illustrating a second embodiment of the heavy object turning apparatus according to the invention.
Figure 7:
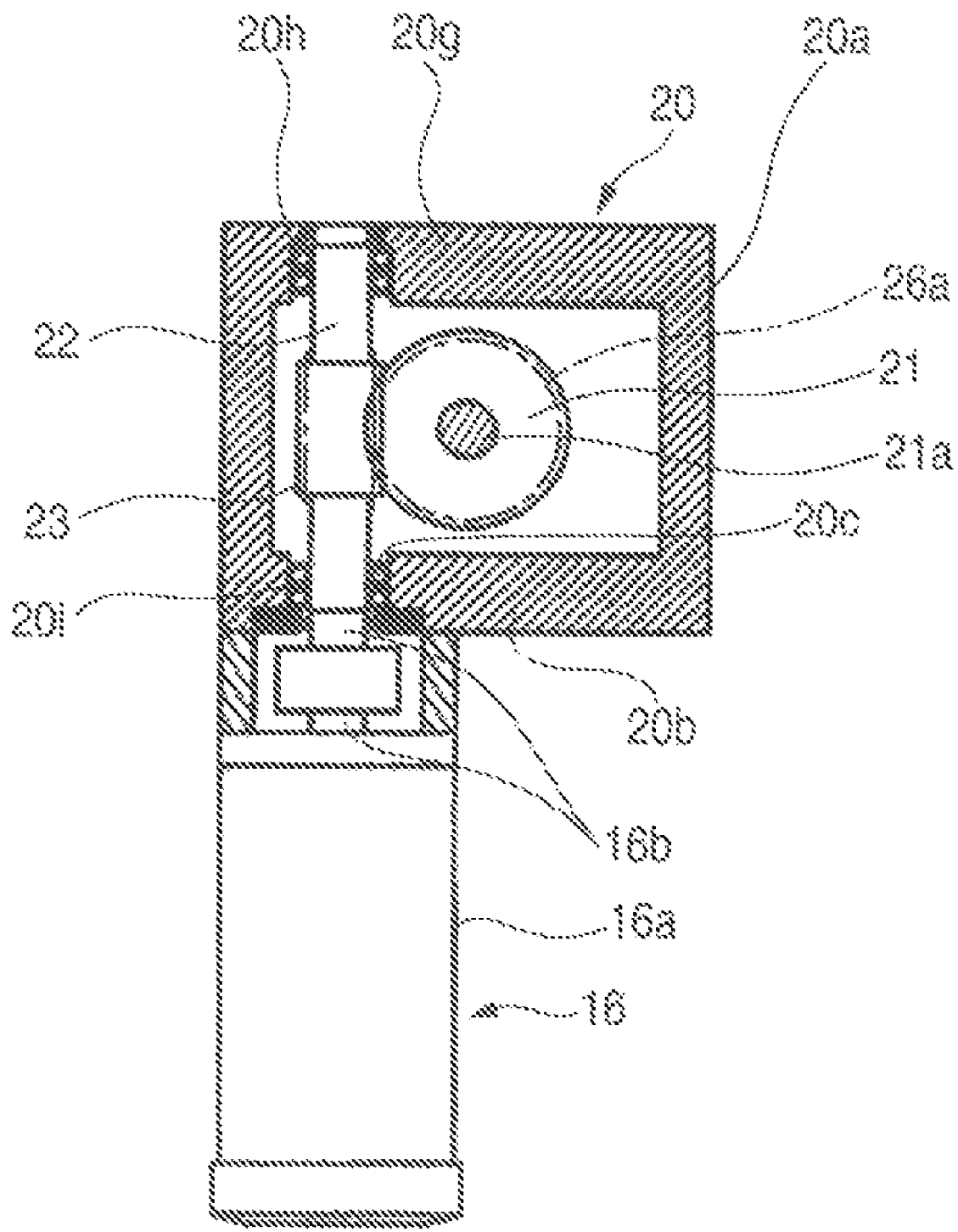
FIG. 7 is a cross-sectional view taken in the direction of arrows G-G shown in FIG. 6.

As shown in FIG. 6, somewhat elongated bolt insertion holes 11d, 11d, . . . , are provided around the periphery of the turning arm 11 in a part at the side of the first flat surface 11a thereof at desired intervals. Then, bolts 11e, 11e, . . . shown in FIG. 8 are engaged and screwed in a shaft hole 29e. The heavy object is fixed to the turning arm 11 by positioning the heavy object in the direction of the drive unit 12 and adjusting the movement thereof in the up-down direction or the lateral direction. Although described in "Best Mode for Carrying Out the Invention", similarly, a concave portion 3b is formed in a top surface 3a of the stand 3 in the second embodiment of the heavy object turning apparatus. A part of the drive unit 12, that is, the motor 16 is accommodated in the concave portion 3n or the hole.

Next, an operation of the second embodiment of the heavy object turning apparatus according to the invention is described below.

The motor 16 rotates at high speed to turn-drive the heavy object such as the test head 5 between a position indicated by a solid line and a position indicated by an imaginary line. Thus, the motor shaft 16b rotates at high speed inside the motor case 16a. The worm pinion 23 fixed to the worm pinion shaft 22 that is fixed to an end portion of the motor shaft 16b engages with the worm wheel 21 of the worm-geared reduction gear 20 serving as the reduction mechanism. The torque of the motor is transmitted to the worm wheel 21. A rotation operation of the worm wheel 21 causes the rotor shaft 26a serving as a rotation output portion to perform a decelerated rotation. Then, the rotation speed of the motor 16 is decreased by the worm gear reduction gear 20 to, for example, about (1/60) the original speed thereof.

Subsequently, the torque of the worm wheel 21, whose rotation speed has been reduced to a first level as above described, is transmitted to the rotor shaft 26a serving as the rotation input portion. The rotor shaft 26a rotates at a speed reduced by the worm-geared reduction gear 20 serving as the anterior reduction mechanism. Then, the torque is transmitted to the spur gear 29g which meshes and engages with the pinion gear 26b formed at the rear end of the rotor shaft 26a. The rotation of the spur gear 29g causes the crankshaft 29f having a crank portion provided at the substantially center thereof to rotate while supported by the roller bearings 30e and 30d disposed adjacently on the front surface of the spur gear 29g. The torque of the crankshaft 29f is transmitted to the two rows of the adjacent externally-toothed gears 30c, 30c. The rotation operation of each of the externally-toothed gears 30c, 30c causes each of the first end plate 29a and the second end plate 29c having the pillar portion 29b of the shaft 29 serving as the rotation output portion to perform decelerated rotation. Additionally, the second end plate 29c is adjacently connected to the first flat surface 11a of the turning arm 11 with bolts 11e, 11e, . . . , and drives the turning arm 11 to decelerate.

Thus, the heavy object such as the test head is driven to turn about 180° from the position indicated by the imaginary line to the position indicated by the solid line shown in FIG. 1. Then, the test head 5 is electrically connected to the contact provided on the top surface of the probe card through the connecting ring 8. The probe apparatus 1 receives a test signal from the tester at the electrode of the semiconductor wafer set on the mount table through the test head 5 and the probe needle of the probe card. Then, an electrical test is performed on each IC chip of the semiconductor wafer.

Thus, the posterior reduction gear 26 reduces the rotation speed of the worm-geared reduction gear 20 serving as the anterior reduction gear to, for example, about (1/100) the original rotation speed thereof. Also, the posterior reduction gear 26 reduces the rotation speed of the motor 16 to, for example, about (1/6000) the original rotation speed thereof. Additionally, a high reduction ratio is obtained by a double reduction mechanism. Thus, the outside diameter of each of the anterior reduction gear 17, the posterior reduction gear 26 and the motor 16 can be reduced. Accordingly, the turning radius of the heavy object such as the test head 5 can be reduced still more. The value of the reduction ratio can be selected by appropriately setting the design dimensions or the shapes of the internal components or the members of the planetary gear type reduction gear 31. Also, the length in the direction of the axis A of the drive unit can be set to be short. Additionally, the drive unit 12 can be compacted.

According to the invention, the heavy object turning apparatus can be constructed using only the anterior reduction gear, that is, only a single reduction gear by fixing the rotor shaft 26a to the turning arm 11.

The invention claimed is:

1. A heavy object turning apparatus having a turning arm which is connected to a heavy object and is turned around a pivot axis, and a drive unit adapted to drive said turning arm to turn, said drive unit having a stationary portion, a rotation input portion, a rotation output portion having an orthogonal flat surface perpendicular to the pivot axis, and a planetary gear type reduction gear having a pair of roller bearings disposed between the stationary portion and the rotation output portion, an orthogonal axis reduction gear configured so that an output axis is on an axis of said planetary gear type reduction gear and that an input shaft is perpendicular to the output axis, and a motor configured so that a motor shaft is disposed in parallel to the orthogonal flat surface, said drive unit fixed to a support base and said support base being non-rotatably fixed to a stand, the support base including an attaching surface fixed to the stand such that the attaching surface is perpendicular to the motor shaft;

an apparatus body disposed on a first side of the stand, the heavy object adapted to be turned nearly one hundred eighty degrees (180°) between a first position wherein the heavy object is located at a first side proximate the apparatus body and a second position wherein the heavy object is located at a second side of the stand, the second side being opposite the first side, and said turning arm has a first flat surface connected to the orthogonal flat surface of said rotation output portion and a second flat surface perpendicular to the first flat surface which is connected to said heavy object and is placed to a heavy object side and that said turning arm and said drive unit are disposed in the width of the heavy object in a direction of the pivot axis around which said heavy object is turned.

2. The heavy object turning apparatus according to claim 1, further comprising a concave portion is formed in said stand, and that said motor is accommodated in said concave portion.

3. A heavy object turning apparatus having a turning arm which is connected to a heavy object and is turned around a pivot axis, and a drive unit adapted to drive said turning arm to turn, said drive unit fixed to a support base and said support base being non-rotatably fixed to a stand at an attaching surface of the support base, an apparatus body disposed on a first side of the stand, characterized in that said drive unit has a stationary portion, a rotation input portion, a rotation output portion having an orthogonal flat surface perpendicular to the pivot axis, and a planetary gear type reduction gear having pair of roller bearings disposed between the stationary portion and the rotation output portion, an orthogonal axis reduction gear configured so that an output axis is on an axis of said planetary gear type reduction gear and that an input shaft is perpendicular to the pivot axis, and a motor configured so that a motor shaft is disposed in parallel to the orthogonal flat surface, said motor shaft oriented generally perpendicular to the attaching surface and said turning arm has a first flat surface connected to the orthogonal flat surface of said rotation output portion and also has a second flat surface perpendicular to the first flat surface, and said turning arm and said drive unit are disposed in the width of the heavy object in a direction of the pivot axis around which said heavy object is turned, the heavy object turnable substantially one hundred eighty degrees (180°) between a first position located proximate the first side of the stand and a second position located proximate a second side of the stand, the second side being opposite the first side.

4. The heavy object turning apparatus according to claim 1, wherein the stand is stationary with respect to an installation base.

5. The heavy object turning apparatus according to claim 3, wherein the stand is stationary with respect to an installation base.

* * * * *